United States Patent
Matsuda et al.

(10) Patent No.: US 8,662,010 B2
(45) Date of Patent: Mar. 4, 2014

(54) PLASMA PROCESSING APPARATUS, PLASMA PROCESSING METHOD, PLASMA FILM DEPOSITION APPARATUS, AND PLASMA FILM DEPOSITION METHOD

(75) Inventors: Ryuichi Matsuda, Takasago (JP); Tadashi Shimazu, Takasago (JP); Masahiko Inoue, Kobe (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 781 days.

(21) Appl. No.: 11/797,601

(22) Filed: May 4, 2007

(65) Prior Publication Data
US 2007/0224364 A1  Sep. 27, 2007

Related U.S. Application Data

(62) Division of application No. 10/514,017, filed as application No. PCT/JP03/07650 on Jun. 17, 2003.

(30) Foreign Application Priority Data

Jun. 19, 2002  (JP) .................................. 2002-178129
Dec. 3, 2002  (JP) .................................. 2002-351250

(51) Int. Cl.
*C23C 16/00*  (2006.01)
*H01L 21/306*  (2006.01)

(52) U.S. Cl.
USPC .............. 118/723 I; 156/345.48; 118/723 AN

(58) Field of Classification Search
USPC ....... 118/723 I, 723 IR, 723 AN; 156/345.48, 156/345.49; 315/111.51
See application file for complete search history.

(56) References Cited

U.S. PATENT DOCUMENTS

| 5,637,961 A * | 6/1997 | Ishii et al. ................ 315/111.51 |
| 5,824,158 A | 10/1998 | Takeuchi et al. |
| 5,907,221 A | 5/1999 | Sato et al. |

(Continued)

FOREIGN PATENT DOCUMENTS

| EP | 0 489 407 A2 | 6/1992 |
| EP | 0759632 A1 | 2/1997 |

(Continued)

OTHER PUBLICATIONS

Dr. Yoshito Fukumoto et al., "Development of Plasma Charge-up Damage Evaluation Wafers", Kobe Steel Engineering Report, vol. 52, No. 2, Sep. 2002, pp. 83-86.

(Continued)

*Primary Examiner* — Luz Alejandro Mulero
(74) *Attorney, Agent, or Firm* — Wenderoth, Lind & Ponack, L.L.P.

(57) ABSTRACT

A plasma film deposition apparatus (plasma processing apparatus) includes a second antenna 11b disposed around an antenna 11a and located outwardly of a ceiling surface. The second antenna 11b is supplied with an electric current flowing in a direction opposite to the direction of an electric current supplied to the antenna 11a by a power supply. Lines of magnetic force F2, heading in a direction opposite to the direction of lines of magnetic force F1 appearing at the site of the antenna 11a, are thereby generated at the site of the second antenna 11b. Thus, the magnetic flux density in the direction of the wall surface is lowered, even when a uniform plasma is generated over a wide range within a tubular container 2.

6 Claims, 7 Drawing Sheets

(56) References Cited

U.S. PATENT DOCUMENTS

| | | | |
|---|---|---|---|
| 5,936,352 | A | 8/1999 | Samukawa et al. |
| 6,016,131 | A | 1/2000 | Sato et al. |
| 6,022,460 | A | 2/2000 | O et al. |
| 6,093,457 | A | 7/2000 | Okumura et al. |
| 6,164,241 | A | 12/2000 | Chen et al. |
| 6,165,311 | A | 12/2000 | Collins et al. |
| 6,350,347 | B1 | 2/2002 | Ishii et al. |
| 6,401,652 | B1 | 6/2002 | Mohn et al. |
| 6,463,875 | B1 | 10/2002 | Chen et al. |
| 2002/0007794 | A1 | 1/2002 | Byun et al. |
| 2004/0020432 | A1* | 2/2004 | Takagi et al. ............ 118/723 I |

FOREIGN PATENT DOCUMENTS

| | | |
|---|---|---|
| EP | 1079671 A2 | 2/2001 |
| EP | 1 168 415 A2 | 1/2002 |
| JP | 4-290428 | 10/1992 |
| JP | 6-89879 | 3/1994 |
| JP | 7-58087 | 3/1995 |
| JP | 7-201813 | 8/1995 |
| JP | 7-245195 | 9/1995 |
| JP | 8-279493 | 10/1996 |
| JP | 9-8010 | 1/1997 |
| JP | 10-70108 | 3/1998 |
| JP | 10-74736 | 3/1998 |
| JP | 10-270192 | 10/1998 |
| JP | 11-509031 | 8/1999 |
| JP | 11-260596 | 9/1999 |
| JP | 2000-68254 | 3/2000 |
| JP | 2000-124190 | 4/2000 |
| JP | 2000-215999 | 8/2000 |
| JP | 3114873 | 9/2000 |
| JP | 2001-85196 | 3/2001 |
| JP | 2002-110565 | 4/2002 |
| TW | 252262 | 4/1983 |
| TW | 86106682 | 5/1986 |
| TW | 86110052 | 7/1986 |
| TW | 336335 | 8/1986 |
| TW | 89103065 | 2/1989 |
| WO | 97/02588 | 1/1997 |
| WO | 99/50883 | 10/1999 |
| WO | 00/00993 | 1/2000 |
| WO | 02/05308 | 1/2002 |

OTHER PUBLICATIONS

Supplementary European Search Report issued Jun. 16, 2009 in counterpart European Application No. 03 76 0870.
European Search Report issued Aug. 2, 2010 in corresponding European Application No. 10 16 6701.
Sumiya Shigeaki et al., "Plasma diagnostics and low-temperature deposition of microcystalline silicon films in ultrahigh-frequency silane plasma", Journal of Applied Physics, American Institute of Physics, New York, US, LNKD-DOI: 10.1063/1.373698, vol. 88, No. 1, Jul. 1, 2000, pp. 576-581, XP012050839, ISSN: 0021-8979.
European Office Action issued Dec. 7, 2011 in corresponding European Application No. 10 166 701.2.

* cited by examiner

PLASMA PROCESSING APPARATUS, PLASMA PROCESSING METHOD, PLASMA FILM DEPOSITION APPARATUS, AND PLASMA FILM DEPOSITION METHOD

This application is a divisional of U.S. application Ser. No. 10/514,017 filed Dec. 16, 2004, which is the National Stage of International Application No. PCT/JP2003/007650, filed Jun. 17, 2003.

TECHNICAL FIELD

This invention relates to a plasma processing apparatus, and a plasma processing method which generate a plasma to process a substrate.

The present invention also relates to a plasma film deposition apparatus, and a plasma film deposition method which generate a plasma to perform film deposition on the surface of a substrate by vapor phase deposition.

Currently, film deposition using a plasma CVD (chemical vapor deposition) apparatus is known in the production of a semiconductor. The plasma CVD apparatus is an apparatus in which a material gas serving as a starting material for a film is introduced into a film deposition chamber within a tubular container, a high frequency is shot from a high frequency antenna to convert the material gas into the state of a plasma, and active excited atoms in the plasma promote a chemical reaction on the surface of a substrate to carry out film deposition. In the plasma CVD apparatus, the high frequency antenna in the shape of a flat ring is disposed on the top of a ceiling surface opposed to the substrate, and power is supplied to the high frequency antenna to shoot a high frequency wave into the tubular container.

A plasma processing apparatus is disclosed, for example, in Japanese Patent No. 3,172,340.

With an inductively coupled plasma CVD apparatus having the flat ring-shaped high frequency antenna disposed on the top of the ceiling surface opposed to the substrate, lines of magnetic force (lines of magnetic flux density) of a coil on the outermost periphery of the high frequency antenna were likely to pass through the wall (tubular surface) of the tubular container. When the lines of magnetic force (lines of magnetic flux density) passed through the wall (tubular surface) of the tubular container, electrons and ions moved along the lines of magnetic force, so that the electrons and ions impinged on the wall of the tubular container, thus posing the possibility of overheating or causing the occurrence of particles by an etching action.

To suppress the impingement of the electrons and ions on the wall surface, it has been conceived to render the diameter of the flat ring-shaped high frequency antenna smaller than the diameter of the tubular container so that the magnetic flux density in the direction of the wall surface at the position of the wall of the tubular container will become low. In this case, it has become difficult to generate a uniform plasma over a wide range relative to the size of the tubular container. This has caused the risk of lowering the efficiency and decreasing the uniformity of plasma within the tubular container.

The present invention has been accomplished in light of the above-mentioned circumstances. An object of the present invention is to provide a plasma processing apparatus and a plasma processing method which can impart a low magnetic flux density in the direction of the wall surface even when generating a uniform plasma over a wide range within the tubular container.

With the plasma CVD apparatus (plasma processing apparatus), moreover, the plasma density is so high that a voltage is applied to the electrode on the surface of the semiconductor owing to a potential difference of space, incurring the risk of destroying the semiconductor device (device destruction due to a charging effect). Currently, there is a demand for the development of a plasma processing apparatus capable of suppressing device destruction due to the charging effect.

The present invention has been accomplished in light of the above-mentioned circumstances. Another object of the present invention is to provide a plasma processing apparatus and a plasma processing method which can suppress device destruction due to the charging effect.

DISCLOSURE OF THE INVENTION

The plasma processing apparatus of the present invention is a plasma processing apparatus in which a flat ring-shaped antenna is disposed at a top of a ceiling surface of a processing chamber, power is supplied by power supply means to generate a plasma within the processing chamber, and processing is applied to a surface of a substrate by excited and activated atoms and molecules. A second antenna, located outwardly of the ceiling surface is disposed around the antenna. A second power supply means is provided for supplying the second antenna with an electric current flowing in a direction opposite to a direction of an electric current supplied to the antenna.

As a result, the plasma processing apparatus can be constituted such that lines of magnetic force heading in a direction opposite to the direction of lines of magnetic force appearing at the site of the antenna are generated at the site of the second antenna, and even when a uniform plasma is generated over a wide range within the tubular container, the magnetic flux density in the direction of the wall surface can be rendered low.

The plasma processing apparatus is also characterized in that the power supply means and the second power supply means are the same alternating current power source.

The plasma processing apparatus is also characterized in that connection between an alternating current power source as the power supply means and the antenna, and connection between an alternating current power source as the second power supply means and the second antenna, are in the same direction. Phase changing means is provided for rendering a phase of the alternating current power source as the power supply means and a phase of the alternating current power source as the second power supply means opposite to each other.

The plasma processing apparatus is also characterized in that connection between an alternating current power source as the power supply means and the antenna, and connection between an alternating current power source as the second power supply means and the second antenna, are in opposite directions.

The plasma processing apparatus is also characterized in that the processing of the surface of the substrate is film deposition for producing a film on the surface of the substrate by the excited and activated atoms and molecules.

The plasma processing method of the present invention is a plasma processing method which supplies power from above a top of a ceiling surface of a processing chamber to generate a plasma within the processing chamber, and applies processing to a surface of a substrate by excited and activated atoms and molecules. An electric current is generated which flows in a direction opposite to a direction of an electric current supplied for generation of the plasma outwardly of the ceiling surface to apply the processing.

As a result, the plasma processing method can be constituted such that even when a uniform plasma is generated over a wide range within the tubular container, the magnetic flux density in the direction of the wall surface can be rendered low.

The plasma film deposition apparatus of the present invention is a plasma film deposition apparatus including a tubular container accommodating a substrate, and a source gas supply means for supplying a source gas into the tubular container. A flat ring-shaped antenna is disposed at a top of a ceiling surface of the tubular container for converting an interior of the tubular container into a plasma by power supply. Power supply means supplies power to the antenna to generate a plasma of the source gas within the tubular container. It is adapted to produce a film on a surface of the substrate by atoms and molecules excited and activated by the plasma within the tubular container. A second antenna is disposed around the antenna and located outwardly of the ceiling surface. A second power supply means supplies the second antenna with an electric current flowing in a direction opposite to a direction of an electric current supplied to the antenna by the power supply means.

As a result, the plasma film deposition apparatus can be constituted such that lines of magnetic force heading in a direction opposite to the direction of lines of magnetic force appearing at the site of the antenna are generated at the site of the second antenna. Even when a uniform plasma is generated over a wide range within the tubular container, the magnetic flux density in the direction of the wall surface can be rendered low.

The plasma film deposition apparatus is also characterized in that the power supply means and the second power supply means are the same alternating current power source.

The plasma film deposition apparatus is also characterized in that connection between an alternating current power source as the power supply means and the antenna, and connection between an alternating current power source as the second power supply means and the second antenna, are in the same direction. Phase changing means is provided for rendering a phase of the alternating current power source as the power supply means and a phase of the alternating current power source as the second power supply means opposite to each other.

The plasma film deposition apparatus is also characterized in that connection between an alternating current power source as the power supply means and the antenna, and connection between an alternating current power source as the second power supply means and the second antenna, are in opposite directions.

The plasma film deposition method of the present invention is a plasma film deposition method which supplies power from above a top of a ceiling surface of a tubular container to generate a plasma within the tubular container, and produces a film on a surface of a substrate by excited and activated atoms and molecules. An electric current is generated which flows in a direction opposite to a direction of an electric current supplied for generation of the plasma, outwardly of the ceiling surface to produce the film.

As a result, the plasma film deposition method can be constituted such that even when a uniform plasma is generated over a wide range within the tubular container, the magnetic flux density in the direction of the wall surface can be rendered low.

The plasma processing apparatus of the present invention is a plasma processing apparatus in which a ring-shaped antenna is disposed at a top of a ceiling surface of a processing chamber. Power is supplied to the antenna by power supply means to generate a plasma within the processing chamber. Processing is applied to a surface of a substrate by excited and activated atoms and molecules. The substrate is located in a region where the plasma has a high density, but has a low electron temperature.

As a result, the substrate can be located in a region where the electron temperature is low even though the electron density is high. Since the region has a low electron temperature, device destruction of the substrate due to the charging effect can be suppressed.

The plasma processing apparatus is also characterized in that the region where the plasma has the high density has an electron density such that there are $10^{10}$ electrons or more per $cm^3$, and the region where the plasma has the low electron temperature is a region where the electron temperature is 1 electronvolt or less.

Thus, device destruction of the substrate due to the charging effect can be reliably suppressed.

The plasma processing apparatus of the present invention is a plasma processing apparatus in which a ring-shaped antenna is disposed at a top of a ceiling surface of a processing chamber, power is supplied to the antenna by power supply means to generate a plasma within the processing chamber, and processing is applied to a surface of a substrate by excited and activated atoms and molecules. A high frequency power source with an output of 2 kW to 15 kW and a frequency of 10 MHz to 30 MHz is connected to the antenna. A distance from a lower surface of the antenna to the substrate is set at 190 mm or more in order to locate the substrate in a region where an electron temperature is 1 electronvolt or less.

Thus, the substrate can be located in a region where the plasma has a low electron temperature even though the plasma has a high density. Since the substrate is located in the region where the electron temperature is low even though the electron density is high, device destruction of the substrate due to the charging effect can be suppressed.

The plasma processing apparatus of the present invention is a plasma processing apparatus in which a ring-shaped antenna is disposed at a top of a ceiling surface of a processing chamber, power is supplied to the antenna by power supply means to generate a plasma within the processing chamber, and processing is applied to a surface of a substrate by excited and activated atoms and molecules. A high frequency source with an output of 2 kW to 15 kW and a frequency of 10 MHz to 30 MHz is connected to the antenna. A distance from a lower surface of the antenna to the substrate is set at 200 mm or more.

Thus, the substrate can be located in a region where the plasma has a low electron temperature even though the plasma has a high density. Since the substrate is located in the region where the electron temperature is low even though the electron density is high, device destruction of the substrate due to the charging effect can be suppressed reliably.

The plasma processing method of the present invention is a plasma processing method which supplies power from above a top of a ceiling surface of a tubular container to generate a plasma within the tubular container, and applies processing to a surface of a substrate by excited and activated atoms and molecules. The processing is applied to the substrate in a region where the plasma has a high density, but has a low electron temperature.

As a result, the substrate can be located in a region where the electron temperature is low even though the electron density is high. Since the region has a low electron temperature, device destruction of the substrate due to the charging effect can be suppressed.

BEST MODE FOR CARRYING OUT THE INVENTION

The present invention will now be described in more detail with reference to the accompanying drawings.

An embodiment of the present invention is described first.

The present invention is a plasma film deposition apparatus in which a source gas (a material gas: e.g., $SiH_4$) is supplied into a film deposition chamber, and a plasma is generated to excite and activate atoms and molecules, which form a film of silicon oxide or silicon nitride on the surface of a substrate. According to this apparatus, power is supplied from above the top of a ceiling surface to a flat ring-shaped antenna to generate a plasma within a tubular container under an inductively coupled system, thereby forming the film of silicon oxide or silicon nitride on the surface of the substrate.

At this time, an electric current flowing in a direction opposite to the direction of a feed current for generating the plasma is generated outwardly of the ceiling surface, whereby a magnetic flux density in the direction of the wall surface at the position of the wall is decreased to suppress impingement of electrons and ions on the wall of the tubular container. As a result, a uniform plasma can be generated over a wide range within the tubular container with the use of the antenna having a diameter fitting the diameter of the tubular container. At the same time, the magnetic flux density in the direction of the wall surface can be decreased to suppress overheating, and suppress the occurrence of particles by an etching action.

Thus, it becomes possible to provide a plasma film deposition apparatus which can impart a low magnetic flux density in the direction of the wall surface even when generating a uniform plasma over a wide range within the tubular container.

The present invention can also be applied to a plasma processing apparatus in which a plasma is generated, and atoms and molecules excited and activated thereby apply processing, such as etching, to the surface of the substrate.

An embodiment in which the present invention is applied to a plasma film deposition apparatus (plasma CVD apparatus) will be described based on the drawings.

Figure 1:
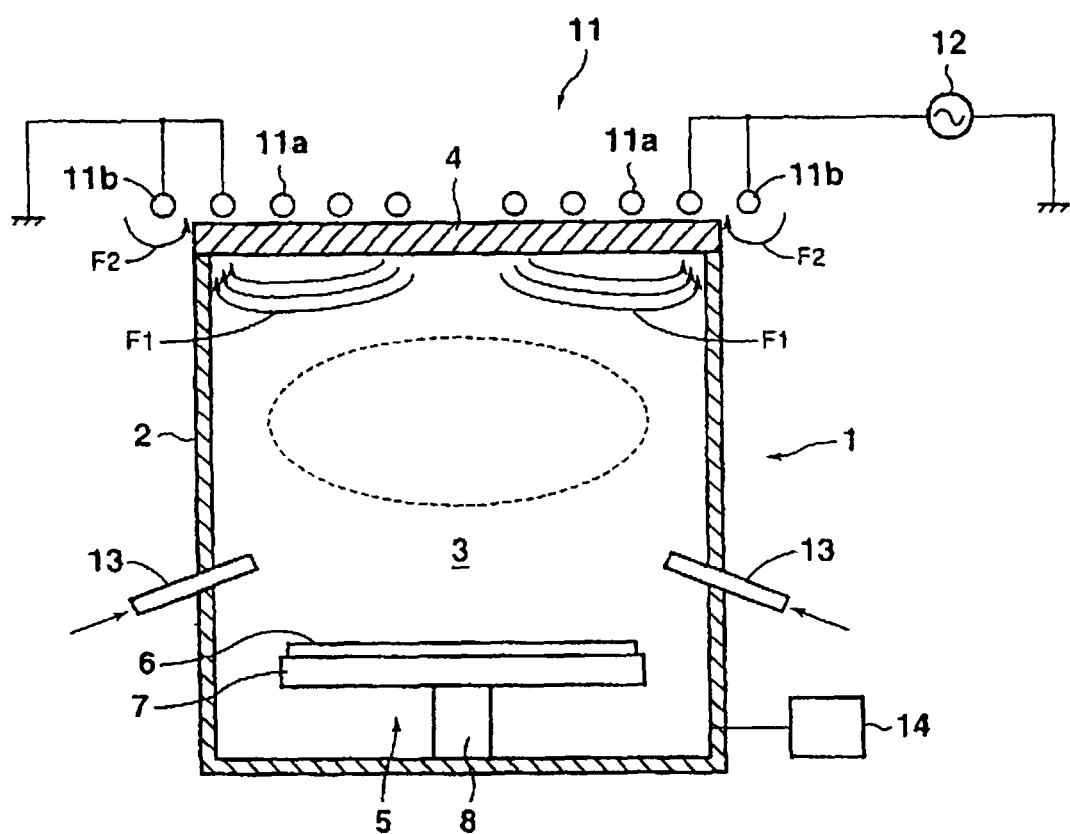
FIG. 1 is a schematic side view of a plasma CVD apparatus according to an embodiment of the present invention.

As shown in FIG. 1, a plasma CVD apparatus 1 is furnished with a tubular container (container) 2 of a cylindrical shape and made of aluminum, and a film deposition chamber 3 is formed within the container 2. A circular ceiling plate 4 made of an insulating material (for example, alumina: $Al_2O_3$) is provided at the top of the container 2, and a wafer support base 5 is provided in the film deposition chamber 3 at the center of the container 2. The wafer support base 5 has a disk-shaped bearing portion 7 for holding a semiconductor substrate 6, and the bearing portion 7 is supported by a support shaft 8.

A high frequency antenna 11, for example, in the form of a circular coil ring (flat ring) is placed on the ceiling plate 4, and a high frequency power source 12 (alternating current power source) is connected (power supply means) to the high frequency antenna 11 via a matching instrument (not shown). Electric power is supplied to the high frequency antenna, whereby an electromagnetic wave is thrown into the film deposition chamber 3 of the container 2. The electromagnetic wave, thrown into the container 2, ionizes a gas within the film deposition chamber 3 to generate a plasma.

The container 2 is provided with, for example, gas supply nozzles 13 as source gas supply means for supplying a material gas, such as silane (for example, $SiH_4$). A source gas, which serves as a material for film deposition (for example, Si), is supplied through the gas supply nozzles 13 into the film deposition chamber 3. The container 2 is also provided with auxiliary gas supply nozzles (not shown), which are made of an insulator material (for example, alumina: $Al_2O_3$), for supplying an inert gas (rare gas) such as argon or helium, or an auxiliary gas such as oxygen or hydrogen. The interior of the container 2 is maintained at a predetermined pressure by a vacuum device 14.

The container 2 is also provided with a carry-in/carry-out port for the substrate 6, although the carry-in/carry-out port is not shown. Through this carry-in/carry-out port, the substrate 6 is carried from a transport chamber (not shown) into the container 2, and carried out of the container 2 to the transport chamber.

With the above-mentioned plasma CVD apparatus 1, the substrate 6 is placed on the bearing portion 7 of the wafer support base 5, and held (by, for example, an electrostatic chuck). A predetermined flow rate of the source gas is supplied through the gas supply nozzles 13 into the film deposition chamber 3, and also a predetermined flow rate of the auxiliary gas is supplied through the auxiliary gas supply nozzles into the film deposition chamber 3, with the interior of the film deposition chamber 3 being set at a predetermined pressure suitable for the conditions for film deposition. Then, electric power is supplied from the high frequency power source 12 to the high frequency antenna 11 to generate a high frequency wave.

By this procedure, the material gas within the film deposition chamber 3 is electrically discharged to be partly turned into the state of a plasma. This plasma impinges on other neutral molecules in the material gas to ionize or excite the neutral molecules further. The thus produced active particles are adsorbed onto the surface of the substrate 6 to cause a chemical reaction with good efficiency, whereby they are deposited to form a CVD film.

With the inductively coupled plasma CVD apparatus 1 having the flat ring-shaped high frequency antenna 11 disposed on the top of the ceiling surface opposed to the substrate 6, lines of magnetic force (lines of magnetic flux density) of a coil on the outermost periphery of the high frequency antenna 11 were likely to pass through the wall (tubular surface) of the container 2. When the lines of magnetic force (lines of magnetic flux density) passed through the wall (tubular surface) of the container 2, electrons and ions moved along the lines of magnetic force, so that the electrons and ions impinged on the wall of the container 2, thus posing the possibility of overheating or causing the occurrence of particles by an etching action.

In the present embodiment, therefore, a second antenna is disposed around an outer part of the antenna on the ceiling surface, whereby an electric current flowing in a direction opposite to the direction of the electric current fed to the antenna is supplied to the second antenna.

Figure 2:
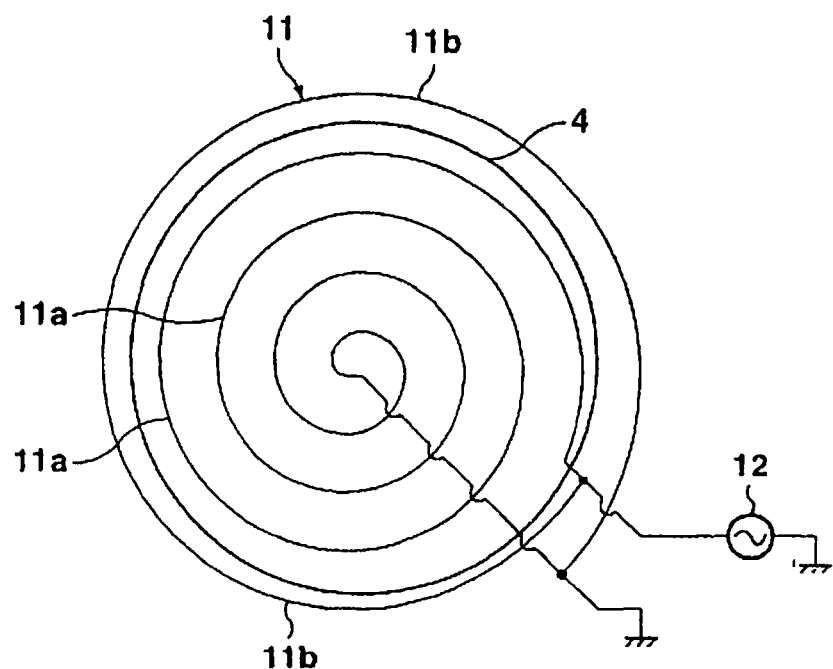
FIG. 2 is a plan view of the plasma CVD apparatus showing the shape of an antenna.

That is, as shown in FIG. 2, the high frequency antenna 11 is made up of an antenna 11a which is a portion of nearly the same diameter as that of the ceiling surface, and a second antenna 11b which is a portion located outwardly of the ceiling surface. An electric current is supplied from the high frequency power source 12 to the site of the second antenna 11b in a state of connection opposite to that for the site of the antenna 11a (i.e., second power supply means). In detail, at the site of the second antenna 11b, the high frequency power source 12 is connected to the coil on the grounded side at the site of the antenna 11a, so that the coil at the site of the antenna 11a on a side where the high frequency power source 12 is connected is brought into a grounded state.

As can be seen from FIG. 1, the second antenna 11b, which is located outwardly of the ceiling surface, is disposed around the antenna 11a in the same plane as the antenna 11a.

Because of the above-described feature, lines of magnetic force, F2, heading in a direction opposite to the direction of lines of magnetic force, F1, appearing at the site of the antenna 11a, are generated at the site of the second antenna 11b. The lines F1 of magnetic force passing through the wall (tubular surface) of the container 2 are merged with the lines F2 of magnetic force heading in the opposite direction to decrease the lines of magnetic force passing through the wall (tubular surface) of the container 2. Thus, the magnetic flux density in the direction of the wall surface at the position of the wall of the container 2 is lowered. This resolves the problem that the electrons and ions impinge on the wall of the container 2, thereby causing overheating or causing the occurrence of particles by an etching action.

Furthermore, the antenna 11a has nearly the same diameter as the diameter of the ceiling surface. Thus, a uniform plasma can be generated over a wide range relative to the size of the container, there is no decrease in the efficiency, and the uniformity of the plasma within the container 2 can be maintained. Hence, the plasma CVD apparatus 1 is constituted such that even when a uniform plasma is generated over a wide range within the container 2, the magnetic flux density in the direction of the wall surface can be rendered low, overheating can be avoided, and the occurrence of particles by an etching action can be prevented.

Referring again to FIG. 1, it is seen that the antenna 11a, being disposed at the top of the ceiling surface, is located inwardly of an inner diameter of the processing chamber 3 or container 2. The antenna 11b, on the other hand, is located outwardly of the inner diameter of the processing chamber 3 or container 2.

Other embodiments of the plasma CVD apparatuses equipped with antennas and power supply means according to other embodiments will be described based on FIGS. 3 to 5. Constituent members other than the antenna and power supply means are the same as those in FIG. 1. Thus, explanations will be offered by reference to the plan views of FIGS. 3 to 5 corresponding to FIG. 2, and descriptions of the features of the same portions are omitted.

A second embodiment will be described based on FIG. 3.

Figure 3:
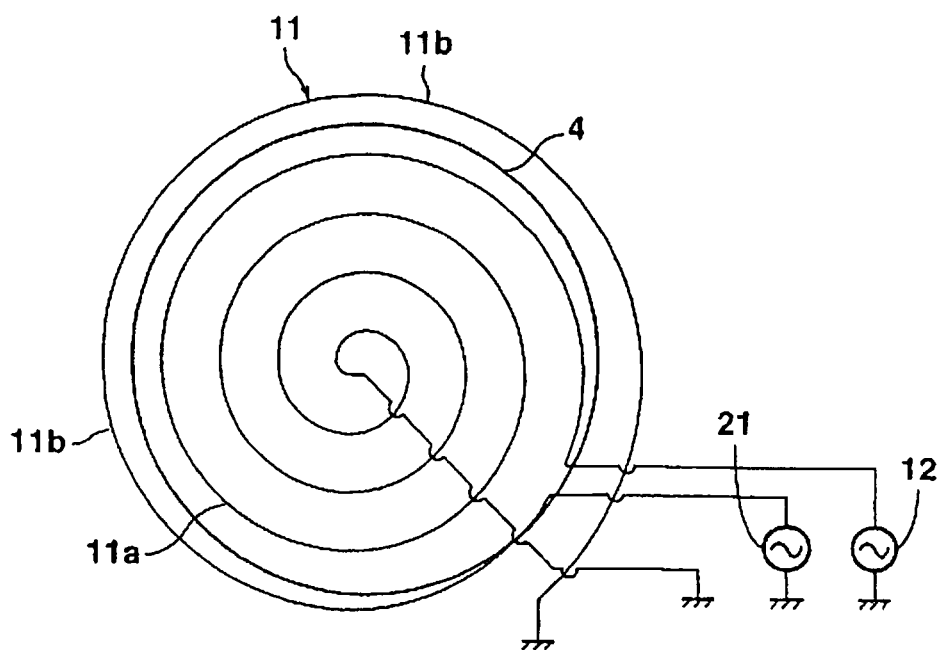
FIG. 3 is a plan view of the plasma CVD apparatus showing the shape of an antenna.

In the embodiment shown in FIG. 3, a high frequency antenna 11, as an antenna, is the same as that in FIGS. 1 and 2 in terms of its feature, and is in the form of a flat coil. A high frequency power source 12 is connected to the site of an antenna 11a, while a second high frequency power source 21 as second power supply means is connected to the site of a second antenna 11b. An electric current is supplied from the second high frequency power source 21 to the site of the second antenna 11b in a state of connection opposite to that for the site of the antenna 11a. In detail, at the site of the second antenna 11b, the high frequency power source 12 is connected to the coil on the grounded side at the site of the antenna 11a, so that the coil at the site of the antenna 11a on a side where the high frequency power source 12 is connected is brought into a grounded state.

Because of the above-described feature, lines of magnetic force, F2, heading in a direction opposite to the direction of lines of magnetic force, F1, appearing at the site of the antenna 11a, are generated at the site of the second antenna 11b, as in the embodiment shown in FIG. 1. The lines F1 of magnetic force passing through the wall (tubular surface) of the container 2 are merged with the lines F2 of magnetic force heading in the opposite direction to decrease the lines of magnetic force passing through the wall (tubular surface) of the container 2. Thus, the magnetic flux density in the direction of the wall surface at the position of the wall of the container 2 is lowered. This resolves the problem that the electrons and ions impinge on the wall of the container 2, thereby causing overheating or causing the occurrence of particles by an etching action.

Furthermore, the antenna 11a has nearly the same diameter as the diameter of the ceiling surface. Thus, a uniform plasma can be generated over a wide range relative to the size of the container, there is no decrease in the efficiency, and the uniformity of the plasma within the container 2 can be maintained. Hence, the plasma CVD apparatus is constituted such that even when a uniform plasma is generated over a wide range within the container 2, the magnetic flux density in the direction of the wall surface can be rendered low, overheating can be avoided, and the occurrence of particles by an etching action can be prevented.

A third embodiment will be described based on FIG. 4.

Figure 4:
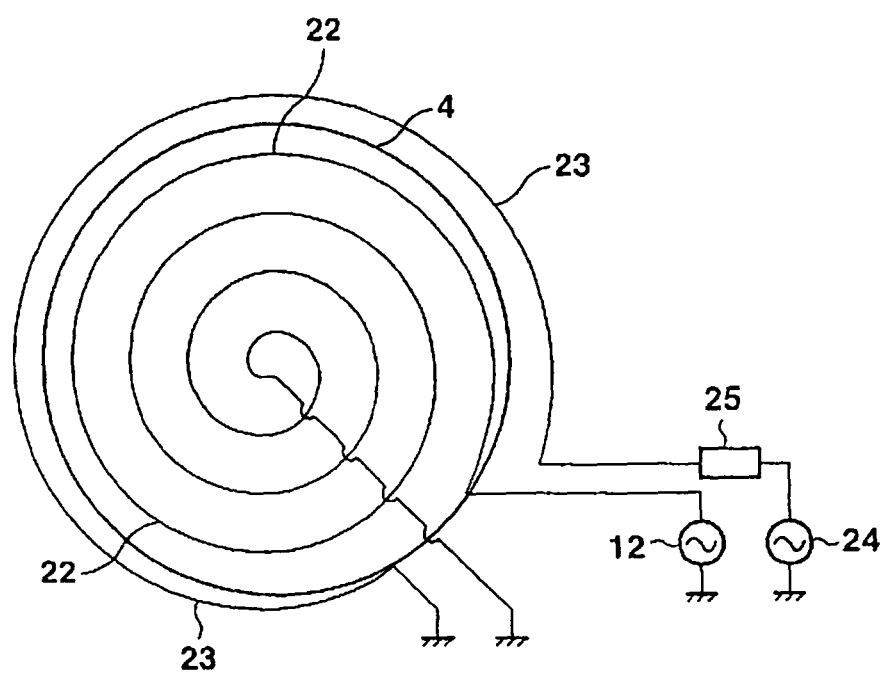
FIG. 4 is a plan view of the plasma CVD apparatus showing the shape of an antenna.

In the embodiment shown in FIG. 4, a flat coil-shaped high frequency antenna 22, as an antenna having nearly the same diameter as the diameter of a ceiling plate 4, is disposed. A second antenna 23, having a different feature from that of the high frequency antenna 22, is disposed outside of the high frequency antenna 22, namely, outwardly of the ceiling surface. A high frequency power source 12 is connected to the high frequency antenna 22, while a second high frequency power source 24 as a second power supply means is connected to the second antenna 23. The high frequency antenna 22 and the second antenna 23 are connected to the high frequency power source 12 and the second high frequency power source 24 in the same direction. The second high frequency power source 24 is connected to the second antenna 23 via a phase shifter 25 as a phase changing means.

An electric current of a phase opposite to that of an electric current fed from the high frequency power source 12 to the high frequency antenna 22 is supplied from the second high frequency power source 24 to the second antenna 23 via the phase shifter 25. Because of this feature, lines of magnetic force heading in a direction opposite to the direction of lines of magnetic force appearing at the site of the high frequency antenna 22 are generated at the site of the second antenna 23, as in the embodiment shown in FIG. 1. The lines of magnetic force passing through the wall (tubular surface) of the container 2 are merged with the lines of magnetic force heading in the opposite direction to decrease the lines of magnetic force passing through the wall (tubular surface) of the container 2. Thus, the magnetic flux density in the direction of the wall surface at the position of the wall of the container 2 is lowered. This resolves the problem that the electrons and ions impinge on the wall of the container 2, thereby causing overheating or causing the occurrence of particles by an etching action.

Furthermore, the high frequency antenna 22 has nearly the same diameter as the diameter of the ceiling surface. Thus, a uniform plasma can be generated over a wide range relative to the size of the container 2, there is no decrease in the efficiency, and the uniformity of the plasma within the container 2 can be maintained. Hence, the plasma CVD apparatus is constituted such that even when a uniform plasma is generated over a wide range within the container 2, the magnetic flux density in the direction of the wall surface can be rendered low, overheating can be avoided, and the occurrence of particles by an etching action can be prevented.

A fourth embodiment will be described based on FIG. 5.

Figure 5:
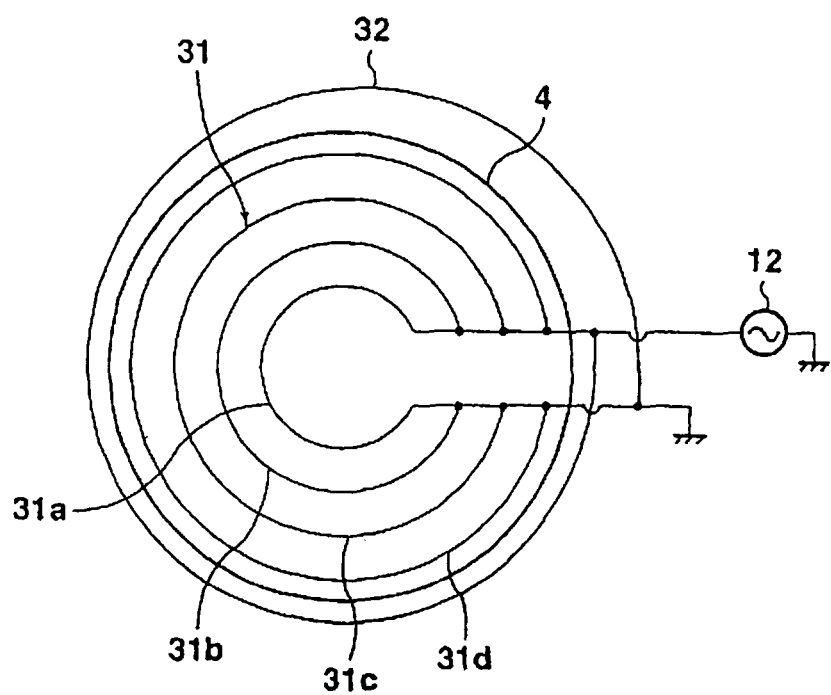
FIG. 5 is a plan view of the plasma CVD apparatus showing the shape of an antenna.

In the embodiment shown in FIG. 5, a high frequency antenna 31, which has nearly the same diameter as the diameter of a ceiling plate 4, is composed of antennas 31a, 31b, 31c and 31d each in the form of a concentric ring. A ring-shaped second antenna 32 is disposed outside of the high frequency antenna 31, namely, outwardly of the ceiling surface. A high frequency power source 12 is connected in parallel to the antennas 31a, 31b, 31c, 31d, and the second antenna 32 is connected to the high frequency power source 12 in a state of connection opposite to that for the ring antenna 31. That is, the second antenna 32 is connected to the high frequency power source 12 in a state opposite to the state of connection of the antenna 31 to the high frequency power source 12, namely, such that the connected side and the grounded side for the second antenna 32 are opposite to those for the antenna 31.

Because of this feature, lines of magnetic force heading in a direction opposite to the direction of lines of magnetic force appearing at the site of the antenna 31 are generated at the site of the second antenna 32, as in the embodiment shown in FIG. 1. The lines of magnetic force passing through the wall (tubular surface) of the container 2 are merged with the lines of magnetic force heading in the opposite direction to decrease the lines of magnetic force passing through the wall (tubular surface) of the container 2. Thus, the magnetic flux density in the direction of the wall surface at the position of the wall of the container 2 is lowered. This resolves the problem that the electrons and ions impinge on the wall of the container 2, thereby causing overheating or causing the occurrence of particles by an etching action.

Furthermore, the antenna 31 has nearly the same diameter as the diameter of the ceiling surface. Thus, a uniform plasma can be generated over a wide range relative to the size of the container 2, there is no decrease in the efficiency, and the uniformity of the plasma within the container 2 can be maintained. Hence, the plasma CVD apparatus is constituted such that even when a uniform plasma is generated over a wide range within the container 2, the magnetic flux density in the direction of the wall surface can be rendered low, overheating can be avoided, and the occurrence of particles by an etching action can be prevented.

Other embodiments will be described.

The present invention is a plasma film deposition apparatus in which a source gas (a material gas: e.g., $SiH_4$) is supplied into a film deposition chamber, and a plasma is generated to excite and activate atoms and molecules, which form a film of silicon oxide or silicon nitride on the surface of a substrate. According to this apparatus, power is supplied from above the top of a ceiling surface to a ring-shaped antenna to generate a plasma within a tubular container under an inductively coupled system, thereby forming a film of silicon oxide or silicon nitride on the surface of the substrate.

The substrate is located in a region where the plasma has a low electron temperature even when the plasma has a high density. The region where the plasma is at a high density has an electron density such that there are $10^{10}$ electrons or more per $cm^3$. The region where the plasma is at a low electron temperature is a region where the electron temperature is 1 electronvolt or less.

Furthermore, a high frequency power source of 10 MHz to 30 MHz is connected to an antenna, and the distance from the lower surface of the antenna to a substrate is set at 190 mm or more in order to locate the substrate in a region where the electron temperature is 1 electronvolt or less.

Alternatively, a high frequency power source of 10 MHz to 30 MHz is connected to an antenna, and the distance from the lower surface of the antenna to a substrate is set at 200 mm or more.

Thus, the substrate is located in a region where the electron temperature is low even though the electron density is high. Since the region has a low electron temperature, device destruction due to the charging effect can be suppressed.

As the present invention, there can be applied a plasma processing apparatus in which a plasma is generated to excite and activate atoms and molecules, which apply processing, such as etching or ashing, to the surface of a substrate.

An embodiment in which the present invention is applied to a plasma film deposition apparatus (plasma CVD apparatus) will be described based on a drawing.

Figure 6:
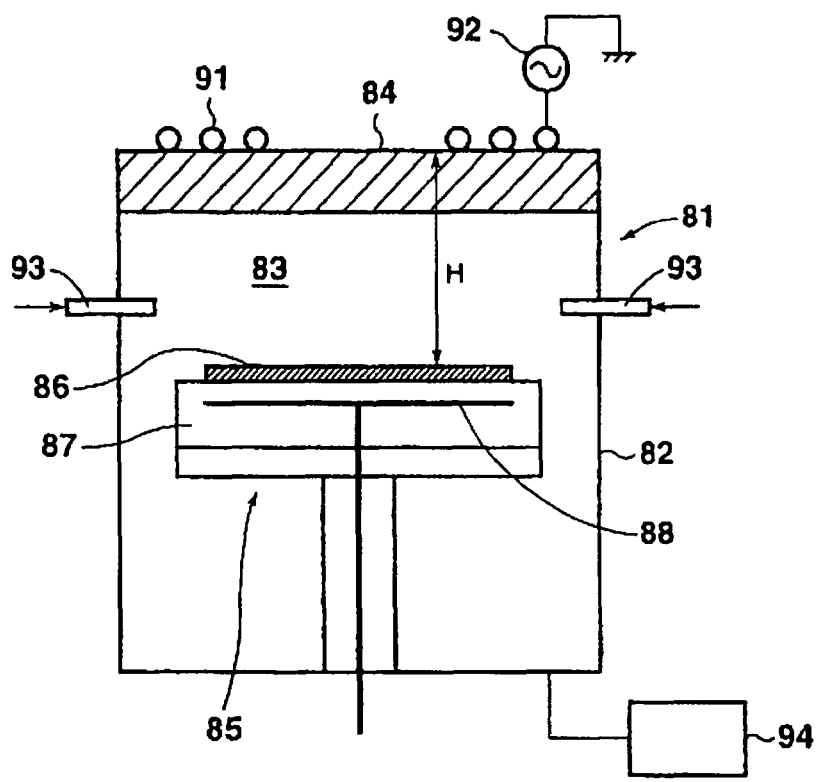
FIG. 6 is a schematic side view of a plasma CVD apparatus according to another embodiment of the present invention.

As shown in FIG. 6, a plasma CVD apparatus 81 is furnished with a tubular container (container) 82 of a cylindrical shape and made of aluminum, and a film deposition chamber 83 (for example, diameter 250 mm to 500 mm) is formed within the container 82. A circular ceiling plate 84 made of an insulator material (for example, alumina: $Al_2O_3$, thickness 30 mm) is provided at the top of the container 82, and a wafer support base 85 is provided in the film deposition chamber 83 at the center of the container 82. The wafer support base 85 has a disk-shaped bearing portion 87 for holding a semiconductor substrate 86, and the substrate 86 is held on the bearing portion 87, for example, by electrostatic chuck means 88.

A high frequency antenna 91, as an antenna, for example, in the form of a circular coil ring (flat ring), is placed on the ceiling plate 84, and a high frequency power source 92 (alternating current power source) is connected (high frequency source) to the high frequency antenna 91 via a matching instrument (not shown). Electric power is supplied to the high frequency antenna 91, whereby an electromagnetic wave is thrown into the film deposition chamber 83 of the container 82. The electromagnetic wave, thrown into the container 82, ionizes a gas within the film deposition chamber 83 to generate a plasma.

The high frequency source, with an output of 2 kW to 15 kW (e.g., 5 kW) and a frequency of 10 MHz to 30 MHz (e.g., 13.56 MHz) is connected to the high frequency antenna 91.

The container 82 is provided with, for example, gas supply nozzles 93 for supplying a material gas, such as silane (for example, $SiH_4$). A source gas, which serves as a material for film deposition (for example, $SiO_2$), is supplied through the gas supply nozzles 93 into the film deposition chamber 83. The container 82 is also provided with auxiliary gas supply nozzles (not shown), which are made of an insulator material (for example, alumina: $Al_2O_3$), for supplying an inert gas (rare gas) such as argon or helium, or an auxiliary gas such as oxygen or hydrogen. The interior of the container 82 is maintained at a predetermined pressure (for example, a vacuum atmosphere on the order of 0.1 Pa to 10 Pa) by a vacuum device 94.

The container 82 is provided with a carry-in/carry-out port for the substrate 86, although the carry-in/carry-out port is not shown. Through this carry-in/carry-out port, the substrate 86 is carried from a transport chamber (not shown) into the container 82, and carried out of the container 82 to the transport chamber.

With the above-mentioned plasma CVD apparatus 81, the substrate 86 is placed on the bearing portion 87 of the wafer support base 85, and held (by, for example, electrostatic chuck means 88). A predetermined flow rate of the source gas is supplied through the gas supply nozzles 93 into the film deposition chamber 83, and also a predetermined flow rate of the auxiliary gas is supplied through the auxiliary gas supply nozzles into the film deposition chamber 83, with the interior of the film deposition chamber 83 being set at a predetermined pressure suitable for the conditions for film deposition. Then, electric power is supplied from the high frequency power source 92 to the high frequency antenna 91 to generate a high frequency electromagnetic wave.

By this procedure, the material gas within the film deposition chamber 83 is electrically discharged to be partly turned into the state of a plasma. This plasma impinges on other neutral molecules in the material gas to ionize or excite the neutral molecules further. The thus produced active particles are adsorbed onto the surface of the substrate 86 to cause a chemical reaction with good efficiency, whereby they are deposited.

The substrate 86 held on the bearing portion 87 of the wafer support base 85 is located in a region where the plasma has a low electron temperature even though the plasma has a high density. That is, the position of the substrate 86 (the height of the bearing portion 87) is set such that the distance H from the lower surface of the high frequency antenna 91 to the substrate 86 is 190 mm to 250 mm (preferably of the order of 200 mm). To adjust the position of the substrate 86, the bearing portion 87 may be rendered free to ascend and descend.

By setting the position of the substrate 86 such that the distance H from the lower surface of the high frequency antenna 91 to the substrate 86 is 190 mm to 250 mm, a high density plasma region is produced which has an electron density of $10^{10}$ electrons or more per cm³ and has an electron temperature of 1 electronvolt (eV) or less.

By locating the substrate 86 in the region where the electron temperature is low even though the electron density is high, device destruction of the substrate 86 due to the charging effect can be suppressed, since this region has a low electron temperature.

Figure 7:
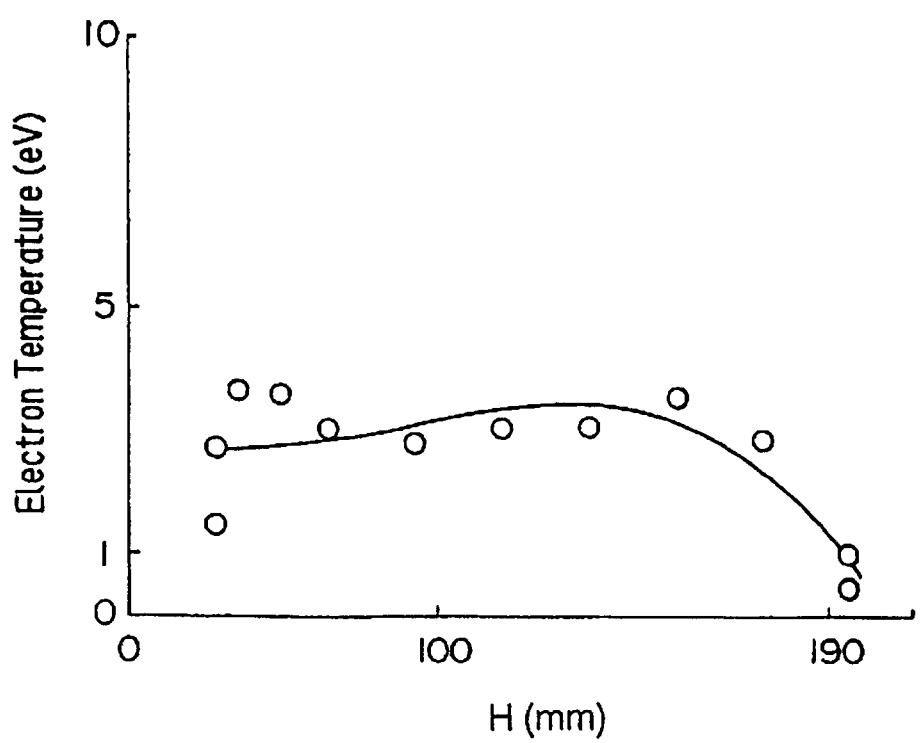
FIG. 7 is a graph showing the relationship between the distance from the lower surface of the antenna to a substrate and an electron temperature.

The relationship between the distance H from the lower surface of the high frequency antenna 91 to the substrate 86 and the electron temperature is explained based on FIG. 7.

As shown in FIG. 7, the electron temperature is several eV when the distance H is in a range of 0 mm to less than 190 mm. When the distance H is 190 mm, the electron temperature is 1 eV. At the distance H of 190 mm or more, the electron temperature is 1 eV or less. By setting the distance H from the lower surface of the high frequency antenna 91 to the substrate 6 to be 190 mm to 250 mm, therefore, device destruction of the substrate 6 due to the charging effect can be suppressed, because of this region having a low electron temperature.

Even if the distance H exceeds 300 mm, device destruction of the substrate 86 due to the charging effect can be suppressed, because of this region having a low electron temperature. However, the greater the distance H, the lower the film deposition rate becomes, making the film deposition time longer. In order to suppress device destruction of the substrate 86 due to the charging effect while maintaining the film deposition rate, therefore, one will note that the distance H from the lower surface of the high frequency antenna 91 to the substrate 6 should desirably be set at 190 mm to 250 mm.

Even if the distance H exceeds 200 mm, the electron temperature sufficiently lowers without lowering of the film deposition rate, so that device destruction of the substrate 86 due to the charging effect can be suppressed reliably. A study involving the distance H set at 200 mm confirmed that although 1,000 films were deposited at a gate oxide film-electrode area ratio of 2,000,000:1, none of the devices of the substrate 86 were destroyed by the charging effect.

By setting the position of the substrate 86 such that the distance H from the lower surface of the high frequency antenna 91 to the substrate 6 is 190 mm to 250 mm, therefore, a high density plasma region having an electron density of $10^{10}$ electrons or more per cm³ becomes a region having an electron temperature of 1 electronvolt (eV) or less. As noted here, the substrate 86 is located in the region at a low electron temperature despite a high electron density. Since this region has a low electron temperature, device destruction of the substrate 6 due to the charging effect can be suppressed.

INDUSTRIAL APPLICABILITY

As described above, there is disclosed a plasma film deposition method in which power is supplied from above a ceiling surface of a tubular container to generate a plasma within the tubular container, and a film is prepared on the surface of a substrate by excited and activated atoms and molecules. In this method, the film is produced, with an electric current in a direction opposite to the direction of a feed current for plasma generation being generated outwardly of the ceiling surface. Thus, it becomes possible to provide a plasma film deposition method which can impart a low magnetic flux density in the direction of the wall surface even when generating a uniform plasma over a wide range within the tubular container.

Moreover, there is disclosed a plasma processing method in which power is supplied from above a ceiling surface of a tubular container to generate a plasma within the tubular container, and processing is applied to the surface of a substrate by atoms and molecules that are excited and activated. In this method, processing is applied to the substrate in a region where the plasma has a low electron temperature even though the plasma has a high density. Thus, the substrate can be located in the region at a low electron temperature despite a high electron density. Thus, device destruction of the substrate by a charging effect can be suppressed, since the region is at a low electron temperature.

The invention claimed is:

1. A plasma processing apparatus comprising:
a processing chamber for generating plasma therein for processing a surface of a substrate with atoms and molecules that are excited and activated in said processing chamber;
a first flat ring-shaped antenna that is disposed at a top of a ceiling surface of said processing chamber;
first power supply means for supplying power to said first flat ring-shaped antenna to generate the plasma within said processing chamber, said first power supply means comprising an alternating current power source;
a second antenna that is located outwardly of a diameter of said ceiling surface of said processing chamber and that is disposed around said first flat ring-shaped antenna in the same plane as said first flat ring-shaped antenna; and
a second power supply means for supplying power to said second antenna so that electric current flows in a direction opposite to a direction of electric current supplied to said first flat ring-shaped antenna, said second power supply means comprising another alternating current power source.

2. The plasma processing apparatus of claim 1, wherein:
a phase changing means is provided for changing the phase such that the phase of current supplied to said first ring-shaped antenna and the phase of current supplied to said second antenna are opposite to each other.

3. A plasma film deposition apparatus comprising:
a tubular container for accommodating a substrate;
a source gas supply for supplying a source gas into said tubular container;
a first flat ring-shaped antenna that is disposed at a top of a ceiling surface of said tubular container for generating a plasma inside of said tubular container in response to power being supplied to said first flat ring-shaped antenna;
first power supply means for supplying power to said first flat ring-shaped antenna to generate the plasma of the source gas within said tubular container for processing a surface of the substrate with atoms and molecules that are excited and activated by the plasma within said tubular container, said first power supply means comprising an alternating current power source;
a second antenna that is located outwardly of a diameter of said ceiling surface of said tubular container and that is disposed around said first flat ring-shaped antenna in the same plane as said first flat ring-shaped antenna; and
a second power supply means for supplying power to said second antenna so that electric current flows in a direction opposite to a direction of electric current supplied to said first flat ring-shaped antenna, said second power supply means comprising another alternating current power source.

4. The plasma processing apparatus of claim 3, wherein:
a phase changing means is provided for changing the phase such that the phase of current supplied to said first ring-shaped antenna and the phase of current supplied to said second antenna are opposite to each other.

5. A plasma processing apparatus comprising:
a processing chamber for generating plasma therein for processing a surface of a substrate with atoms and molecules that are excited and activated in said processing chamber;
a first flat ring-shaped antenna that is disposed at a top of a ceiling surface of said processing chamber and that is located inwardly of an inner diameter of said processing chamber;
first power supply means for supplying power to said first flat ring-shaped antenna to generate the plasma within said processing chamber, said first power supply means comprising an alternating current power source;
a second antenna that is located outwardly of the inner diameter of said processing chamber and that is disposed around said first flat ring-shaped antenna in the same plane as said first flat ring-shaped antenna; and
a second power supply means for supplying power to said second antenna so that electric current flows in a direction opposite to a direction of electric current supplied to said first flat ring-shaped antenna, said second power supply means comprising an another alternating current power source.

6. A plasma film deposition apparatus comprising:
a tubular container accommodating a substrate;
a source gas supply means for supplying a source gas into said tubular container;
a first flat ring-shaped antenna that is disposed at a top of a ceiling surface of said tubular container for generating a plasma inside of said tubular container in response to power being supplied to said first flat ring-shaped antenna and that is located inwardly of an inner diameter of said tubular container;
first power supply means for supplying power to said first flat ring-shaped antenna to generate the plasma of the source gas within said tubular container for processing a surface of a substrate with atoms and molecules that are excited and activated by the plasma within said tubular container, said first power supply means comprising an alternating current power source;
a second antenna that is located outwardly of the inner diameter of said tubular container and that is disposed around said first flat ring-shaped antenna in the same plane as said first flat ring-shaped antenna; and
second power supply means for supplying power to said second antenna so that electric current flows in a direction opposite to a direction of electric current supplied to said first flat ring-shaped antenna, said second power supply means comprising an another alternating current power source.

* * * * *